United States Patent
Hsu et al.

(10) Patent No.: US 7,733,724 B2
(45) Date of Patent: Jun. 8, 2010

(54) CONTROLLING GLOBAL BIT LINE PRE-CHARGE TIME FOR HIGH SPEED EDRAM

(75) Inventors: Kuoyuan (Peter) Hsu, San Jose, CA (US); Bing Wang, Milpitas, CA (US); Young Suk Kim, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 13 days.

(21) Appl. No.: 11/970,188

(22) Filed: Jan. 7, 2008

(65) Prior Publication Data

US 2009/0141570 A1    Jun. 4, 2009

Related U.S. Application Data

(60) Provisional application No. 60/991,646, filed on Nov. 30, 2007.

(51) Int. Cl.
*G11C 7/00* (2006.01)
(52) U.S. Cl. .................. 365/203; 365/205; 365/233.16; 365/189.02; 365/189.08; 365/204; 365/210.12
(58) Field of Classification Search .................. 365/203, 365/205, 233.16, 189.02, 189.08, 204, 210.12
See application file for complete search history.

(56) References Cited

U.S. PATENT DOCUMENTS

| | | | | |
|---|---|---|---|---|
| 5,828,594 A * | 10/1998 | Fujii | ............................ | 365/63 |
| 5,995,439 A * | 11/1999 | Watanabe et al. | ...... | 365/230.03 |
| 6,452,851 B1 * | 9/2002 | Endo et al. | .................. | 365/205 |
| 6,515,887 B2 * | 2/2003 | Fujimoto | ..................... | 365/63 |
| 6,567,315 B2 * | 5/2003 | Takase et al. | .......... | 365/185.28 |
| 6,928,026 B2 * | 8/2005 | Anvar et al. | ........... | 365/233.16 |
| 7,355,881 B1 * | 4/2008 | Dankert et al. | .............. | 365/156 |
| 7,551,474 B2 * | 6/2009 | Kim | ............................ | 365/149 |

\* cited by examiner

*Primary Examiner*—Viet Q Nguyen
(74) *Attorney, Agent, or Firm*—Slater & Matsil, L.L.P.

(57) ABSTRACT

A method of operating a memory includes performing a write operation and a read operation on a memory cell. The write operation includes starting a first global bit line (GBL) pre-charge on a GBL; and after the first GBL pre-charge is started, enabling a word line to write into the memory cell, wherein the steps of starting the first GBL pre-charge and enabling the word line have a first time interval. The read operation includes starting a second GBL pre-charge on the GBL; and after the second GBL pre-charge is started, enabling the word line to read from the memory cell, wherein the steps of starting the second GBL pre-charge and enabling the word line have a second time interval. The first time interval is greater than the second time interval.

31 Claims, 5 Drawing Sheets

CONTROLLING GLOBAL BIT LINE PRE-CHARGE TIME FOR HIGH SPEED EDRAM

This application claims priority to U.S. Provisional Application Ser. No. 60/991,646, filed Nov. 30, 2007, entitled "Controlling Global Bit Line Pre-Charge Time for High Speed eDRAM," which patent application is incorporated herein by reference.

TECHNICAL FIELD

This invention relates generally to dynamic random access memories (DRAM), and more particularly to improving the write speed of embedded DRAMs (eDRAM).

BACKGROUND

Embedded dynamic random access memories (eDRAM) are widely used for their improved performances in high-speed applications, such as computing units (CPU).

In eDRAM circuits, local bit lines are connected to eDRAM cells and global bit lines, which are further connected to control circuits. Through the global bit lines and the connecting local bit lines, write operations may be performed to write to eDRAM cells. The local bit lines typically include two lines with often-inversed phases, namely BL and ZBL. The global bit lines also typically include two lines with often-inversed phases, namely GBL and ZGBL.

Preferably, in a write operation of an eDRAM cell, the global bit lines are pre-charged to the desirable voltage levels. After the pre-charge is finished, a word line connected to the eDRAM cell is enabled to start writing into the eDRAM cell. After the write operation, the global bit lines need to be pre-charged again, so that the next write operation may be performed. The two consecutive write operations are referred to as back-to-back write operations. The back-to-back write operations run into a problem when worked under high frequencies: there may not be enough time for global bit lines to be pre-charged because the time allowed for pre-charging is too short. To make it worse, although the pre-charge time may be prolonged by starting the pre-charge earlier, such an action will adversely affect the read operations since read operations prefer the corresponding pre-charges to start late.

FIG. 1 illustrates waveforms obtained from a convention eDRAM circuit. A GBL pre-charge enable signal 20 enables the pre-charge (the rising edge 20). The pre-charge results in the voltage (line 6) of global bit line GBL to rise, and the voltage (line 8) of global bit line ZGBL to drop. However, before global bit line ZGBL can drop to ground level (0V), the rising edge 3 of the word line voltage (line 2) has enabled the writing (at time T). Accordingly, there is not enough time left for the pre-charge to finish. In this case, the GBL pre-charge enable signal 20 is used for enabling the global bit line pre-charges of both read and write operations. Therefore, regardless of whether the subsequent operation is a read or a write operation, the pre-charge time is the same.

The un-finished pre-charge will adversely affect the local bit lines. It is preferred that when local bit lines BL and ZBL go into a charge-sharing stage, the global bit lines are pre-charged fully, for example, the global bit line ZGBL to substantially reach ground voltage, while the global bit line GBL has a voltage substantially reaching the operation voltage VDD. However, inadequate pre-charge time will cause the local bit lines (line 10 indicating the voltage of local bit line BL, and line 12 indicating the voltage of local bit line BLB) to start sharing charges (section 14) before global bit line ZGBL is fully grounded. The signals on the local bit lines BL and BLB will thus be adversely affected.

Accordingly, what is needed in the art is a method for fully pre-charging global bit lines, so that write operations may be improved, while at the same time without causing the degradation in read operations.

SUMMARY OF THE INVENTION

In accordance with one aspect of the present invention, a method of operating a memory includes performing a write operation and a read operation on a memory cell. The write operation includes starting a first global bit line (GBL) pre-charge on a GBL; and after the first GBL pre-charge is started, enabling a word line to write into the memory cell, wherein the steps of starting the first GBL pre-charge and enabling the word line to write have a first time interval. The read operation includes starting a second GBL pre-charge on the GBL; and after the second GBL pre-charge is started, enabling the word line to read from the memory cell, wherein the steps of starting the second GBL pre-charge and enabling the word line to read have a second time interval. The first time interval is greater than the second time interval.

In accordance with another aspect of the present invention, a method of operating a memory includes generating a GBL pre-charge signal for a write operation (GEQ_write signal) on a first node of the memory; and generating a GBL pre-charge signal for a read operation (GEQ_read signal) on a second node of the memory, wherein the second node is different from the first node. The second node does not carry the GEQ_write signal.

In accordance with yet another aspect of the present invention, a method of operating a memory includes generating a GEQ_write signal on a first node of the memory; applying the GEQ_write signal to the memory to start a first GBL pre-charge to a GBL; writing into a memory cell controlled by the GBL, wherein the steps of starting the first GBL pre-charge and writing into the memory cell have a first time interval; generating a GEQ_read signal on a second node of the memory, wherein the second node is different from the first node; applying the GEQ_read signal to the memory to start a second GBL pre-charge; and reading from the memory cell, wherein the steps of starting the second GBL pre-charge and reading from the memory cell have a second time interval smaller than the first interval.

In accordance with yet another aspect of the present invention, a memory circuit includes a GBL pre-charge signal generator, which includes a first output node outputting a GEQ_write signal; and a second output node outputting a GEQ_read signal, wherein the second output node does not output the GEQ_write signal.

In accordance with yet another aspect of the present invention, a memory circuit includes a local bit line (LBL); a GBL; a multiplexer (MUX) coupling the LBL and the GBL; and a MUX signal generator. The MUX signal generator includes a first input node coupled to a write enable signal node; a second input node coupled to a local sensing activation enable signal node; and an output node coupled to the MUX.

In accordance with yet another aspect of the present invention, a memory circuit includes a first and a second LBL; a first and a second GBL; a MUX coupling the first LBL to the first GBL, and the second LBL to the second GBL; and a GBL pre-charge signal generator including a first output node outputting a GEQ_write signal; a second output node outputting a GEQ_read signal; and a third node outputting a write enable signal. The memory circuit further includes a MUX signal generator including a first input coupled to the third node of the GBL pre-charge signal generator; a second input node coupled to a local sensing activation enable signal node; and an output node coupled to the MUX. The memory circuit further includes a NOR gate including a first input coupled to the first output node of the GBL pre-charge signal generator; a second input coupled to the second output node of the GBL pre-charge signal generator; and an output coupled to an equalization circuit coupled between the first and the second GBLs.

The advantageous features of the embodiments of the present invention include improved write speed and improved reliability of the memory circuit.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments of the present invention are discussed hereinafter by referring to embedded dynamic random access memories (eDRAM), partially for the reason that eDRAMs are often operated at very high frequencies, and thus they need to have very high write and read speeds. However, the teaching provided by the embodiments of the present invention may be readily used for other types of DRAMs.

Figure 1:
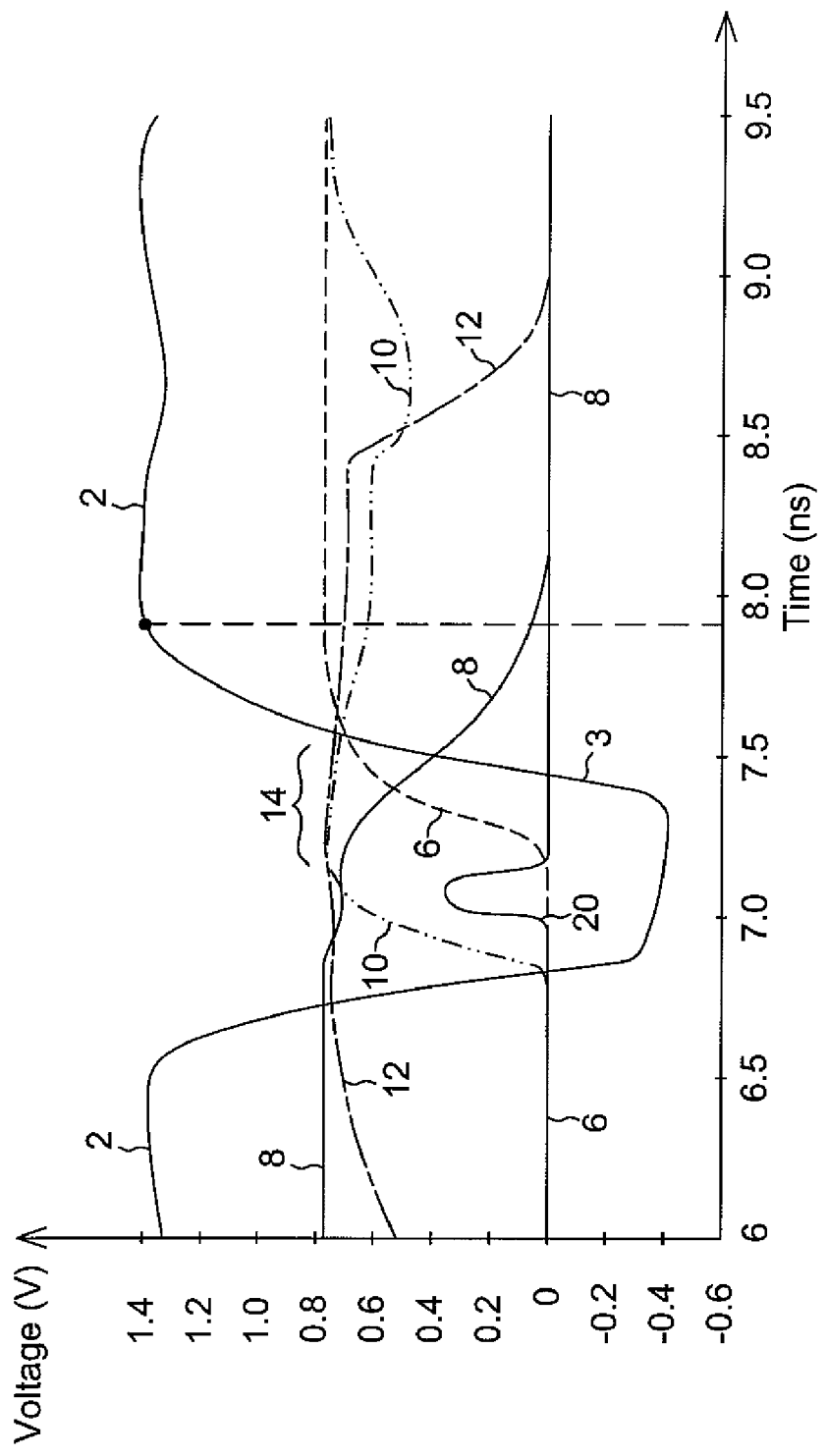
FIG. 1 illustrates waveforms of a write operation in a conventional memory circuit.
Figure 2:
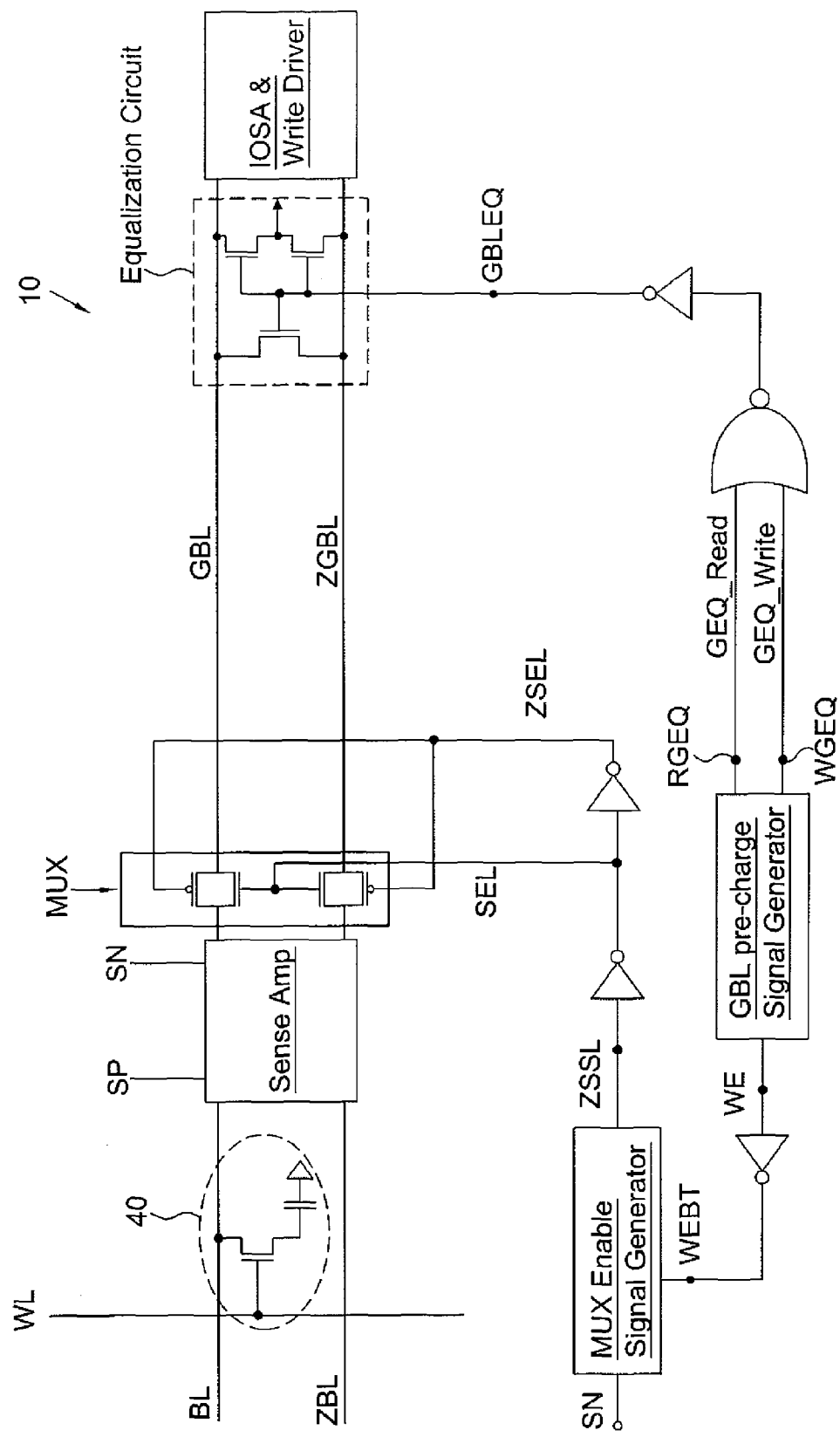
FIG. 2 illustrates a block diagram of an embodiment of the present invention.

FIG. 2 illustrates an embodiment of the present invention, which includes a part of an eDRAM memory 10. In this embodiment, only a pair of local bit lines BL (also referred to as LBL) and ZBL (also referred to as BL bar, or LZBL), and a pair of global bit lines GBL and ZGBL (also referred to as GBL bar) are shown, wherein local bit lines BL and ZBL are complementary to each other, and global bit lines GBL and ZGBL are complementary to each other. One skilled in the art will realize that a memory typically includes a plurality of local bit lines and a plurality of global bit lines.

A multiplexing (MUX) enable (or disable) signal, which is carried on MUX enable/disable line (or node) ZSSL, is used to connect or disconnect bit lines BL and GBL, and to connect or disconnect bit lines ZBL and ZGBL through a multiplexer (also referred to as MUX). In an exemplary embodiment, the MUX includes a pair of pass-gate transistors, and is controlled by the voltage on nodes SEL and ZSEL. When the voltage on node SEL is low, and the voltage on node ZSEL is high, the MUX disconnects the connections. eDRAM cell 40, which includes a transistor and a capacitor, is illustrated to symbolize the memory cells in memory 10. It is to be realized, however, the memory cells may have a different structure, and be connected differently, than eDRAM cell 40. Preferably, memory 10 includes array(s) of memory cells arranged in rows and columns. The transistor in each of the memory cells may have, for example, a source connected to one of the local bit lines, such as BL. The gate of the transistor is connected to a word line WL.

The MUX disable/enable signal on MUX enable/disable line ZSSL is generated by a MUX enable signal generator, which has an input node SN receiving a local sensor enable signal, and an input node WEBT receiving write enable signals. The write enable signals are generated by a GBL pre-charge signal generator, which is used for generating a plurality of enable (or disable) signals. In an exemplary embodiment, the GBL pre-charge signal generator generates an inversed write enable signal on node WE. An inverter is then used to generate the write enable signal on node WEBT.

The GBL pre-charge signal generator further generates a GEQ_write signal on node WGEQ and a GEQ_read signal on node RGEQ. The GEQ_write signal is used for pre-charging GBLs for write operations, while the GEQ_read signal is used for pre-charging GBLs for read operations. Preferably, the GEQ_write signals and GEQ_read signals have different timings. This is different than in conventional memories, in which the global pre-charge signals for write operations and global pre-charge signals for read operations were not distinguished, and hence the GBL enable signals were generated without considering whether the subsequent operations are write operations or read operations. Also, in conventional memories, the global pre-charge signals for write operations and the global pre-charge signals for read operations were output to a same output node of the respective generating circuit.

The GEQ_read and GEQ_write signals are combined to generate a global bit line equalization enable (GBLEQ) signal on node GBLEQ, which is to enable the equalization of global bit lines GBL and ZGBL. An equalization circuit, which may be formed of three transistors, connects global bit lines GBL and ZGBL to each other and to the ground. When any of the GEQ_read and GEQ_write signals goes to high, the voltage on node GBLEQ goes higher, and hence the global bit lines GBL and ZGBL are shorted to ground. At this time, the global bit line ZGBL starts to be pre-charged to ground. Subsequently, the voltage on node GBLEQ goes to low to break the shorting path, and the input/output sensing amplifier (IOSA) & write driver starts driving the global bit lines GBL and ZGBL to VDD and ground, respectively.

Figure 3:
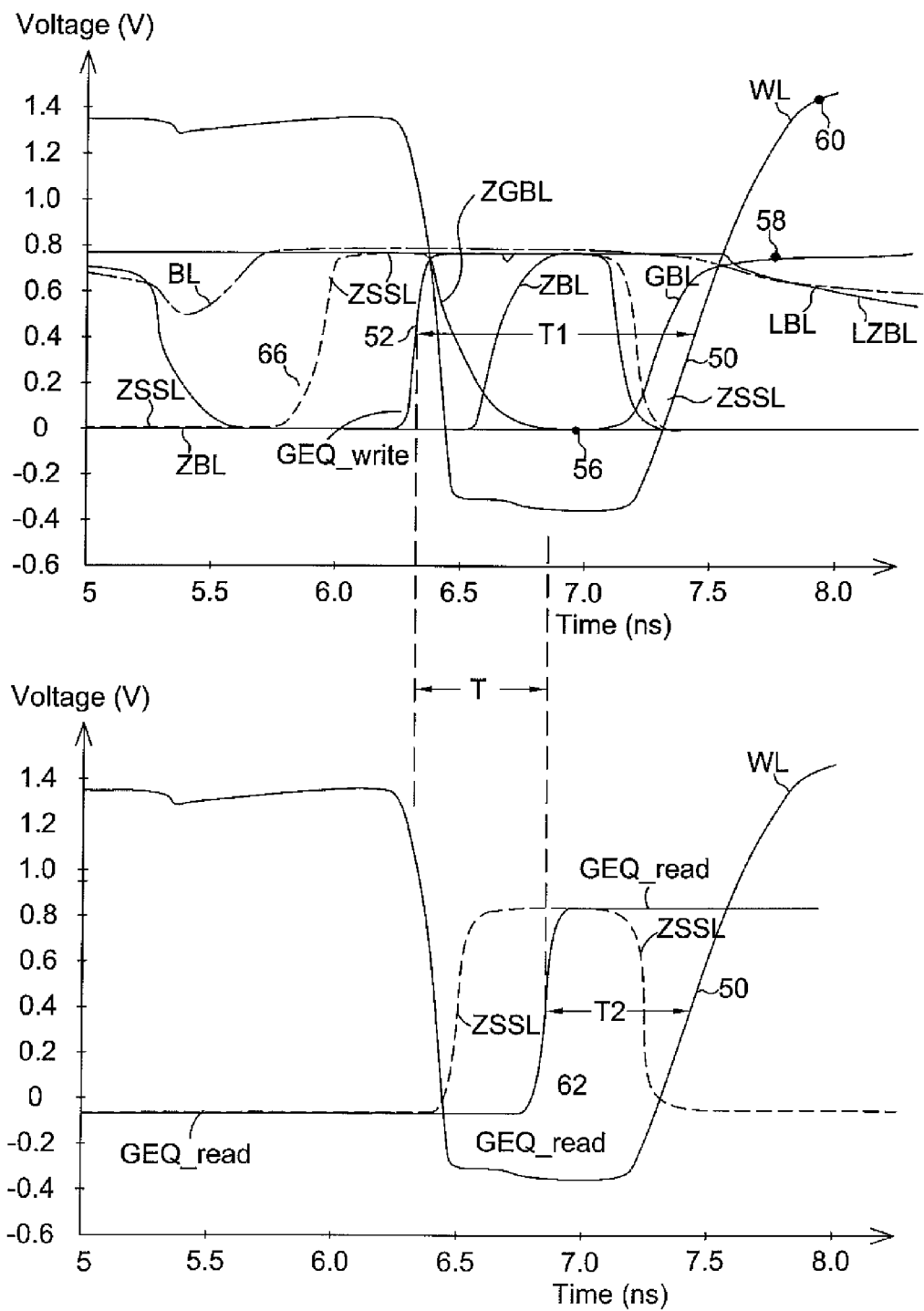
FIG. 3 illustrates waveforms of a write and a read operation in a memory circuit.

FIG. 3 illustrates waveforms of the circuit shown in FIG. 2, wherein the top waveforms are obtained from a write operation, while the bottom waveforms are obtained from a read operation. For a clear view, the voltage on a line or a node may be marked using the same name as the respective line or node. For example, the voltage on word line WL is indicated as WL, the voltage on MUX enable line ZSSL is indicated as ZSSL. The voltages on nodes RGEQ and WGEQ (refer to FIG. 2) are indicated as GEQ_read and GEQ_write, respectively. Referring to the top waveforms, it is noted that at a time before the rising edge 50 (referred to as word line enable signal hereinafter) of the word line voltage WL, the rising edge 52 (referred to as GEQ_write signal hereinafter) of the GEQ_write voltage has occurred to enable the GBL pre-charge. Accordingly, the voltage level of global bit line ZGBL starts to be pre-charged to the ground voltage level. At point 56, the global bit line ZGBL is already fully pre-charged. The pre-charge of global bit line GBL, on the other hand, is finished at point 58. Both points 56 and 58 occur earlier than when word line WL has been enabled (at point 60). Therefore, in this embodiment, the global bit lines GBL and ZGBL are fully pre-charged before the writing starts. The waveforms of local bit lines BL (LBL) and ZBL (LZBL) are also shown.

Although in the exemplary embodiment shown in FIG. 3, the rising edges of the above-discussed signals are the starting points of the respective actions (such as the disabling of the MUX and the enabling of word line WL), one skilled in the art will realize that if the memory circuit are designed differently, the falling edges may also be used.

The bottom waveforms are obtained from a read operation. Please note that the word line voltages WL in the top and the bottom waveforms are aligned. When comparing the top and the bottom waveforms, it is noted that the rising edge 62 (referred to as GEQ_read signal hereinafter) of the GEQ_read voltage has occurred later than the rising edge 52 of the GEQ_write voltage, relative to the respective rising edges 50 of the word line voltage WL. In the top waveforms, the rising edge 52 of the GEQ_write voltage and the rising edge 50 of the word line voltage WL have a time interval T1. In the bottom waveforms, the rising edge 62 of the GEQ_read voltage and the rising edge 50 of the word line voltage WL have a time interval T2. Time interval T1 is preferably greater than time interval T2. Accordingly, the GEQ_write signal is referred to as being "earlier" than the GEQ_read signal. The difference between time interval T1 and time interval T2 is referred to as time difference T. The preferred time difference T depends on the frequency of the operations. The time difference T is preferably greater than 30 percent of a period of the clock (for example, about 2.3 ns) used by memory 10. In an exemplary embodiment, the time difference T is about 0.7 nanoseconds or greater for if a 430 MHz clock is used by memory 10. Preferably, the rising edge 62 of the GEQ_read voltage occurs even after the rising edge of the global bit line pre-charge signal in conventional memories, relative to the respective word line enable signals. In FIG. 3, the time intervals T1 and T2 are measured using the middle points of rising edges 52 and 62 as references. However, other points, for example, the points at which the word line WL is fully enabled, may also be used to calculate time intervals T1 and T2, and the resulting time difference T will not be affected.

It is to be noted that the operations of memories often include many read and write cycles. Also, at a certain time, an operation to a memory cell can only be either the write operation or the read operation, but not both. Therefore, throughout the description, when a GEQ_write signal is referred to as being earlier than a GEQ_read signal, it does not mean the GEQ_write signal is actually earlier in time than the GEQ_read signal. Instead, each of the GEQ_write and GEQ_read signals are compared to the respective word line enable signal of the same (read or write) operation. Accordingly, referring to a GEQ_write signal as being earlier than a GEQ_read signal means that the time interval T1 is greater than the time interval T2. Also when the word line enable signal (signal the rising edges 50) of the word line voltage WL are used as reference points, the rising edges 50 are the ones "immediately" following the respective GEQ_write signals or the GEQ_read signals, with no other rising edges therebetween.

Referring back to FIG. 2, the MUX needs to be disabled before the global bit line pre-charge starts. As a result, the connections from local bit lines BL and ZBL to the global bit lines ZBL and ZGBL are broken. In FIG. 3, the disabling of the MUX starts at the rising edge 66 (referred to as write MUX disable signal hereinafter) of the voltage ZSSL, and the rising edge 66 occurs earlier than the GEQ_write signal. In addition, the rising edge 66 of the voltage ZSSL for the write operation also occurs earlier than the rising edge 67 (referred to as read MUX disable signal hereinafter) of the voltage ZSSL for the read operation, wherein the term "earlier" may use the respective word line enable time as a reference.

Figure 4:
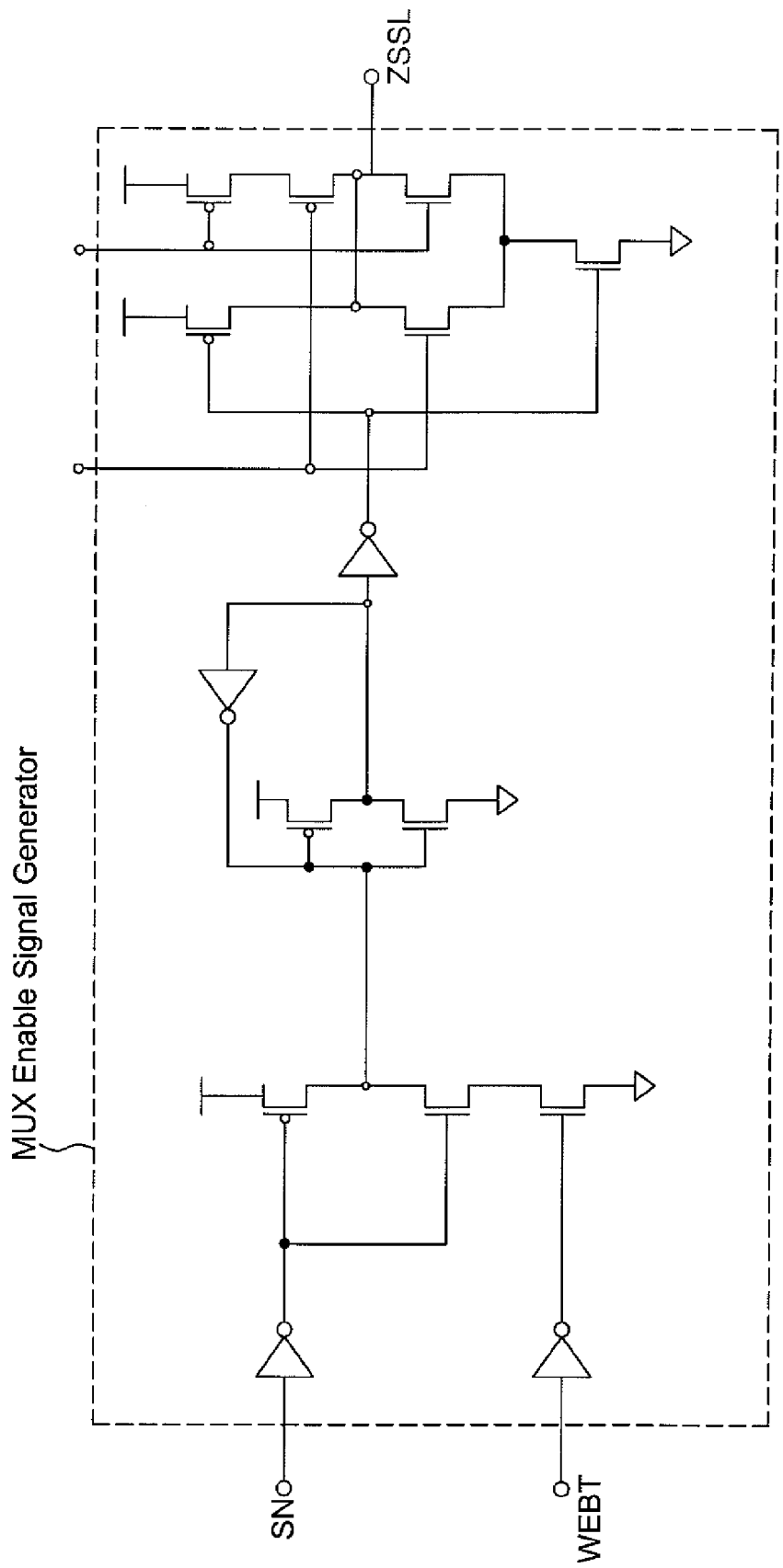
FIG. 4 illustrates an exemplary MUX enable signal generator.

FIG. 4 illustrates an exemplary MUX enable signal generator for generating the MUX enable/disable signal on node ZSSL. The MUX enable signal generator has two input nodes, input node SN for receiving local sensor enable signals, and input node WEBT for receiving write enable signals. The timing of the MUX disable/enable signal at node ZSSL is thus coupled to the timing of the write enable signals and the local sensor enable signals. Accordingly, it is ensured that the MUX is disabled before the global bit line pre-charge starts. Correspondingly, the times the MUX is disabled for write operations are ensured to be earlier than that for read operations.

Figure 5:
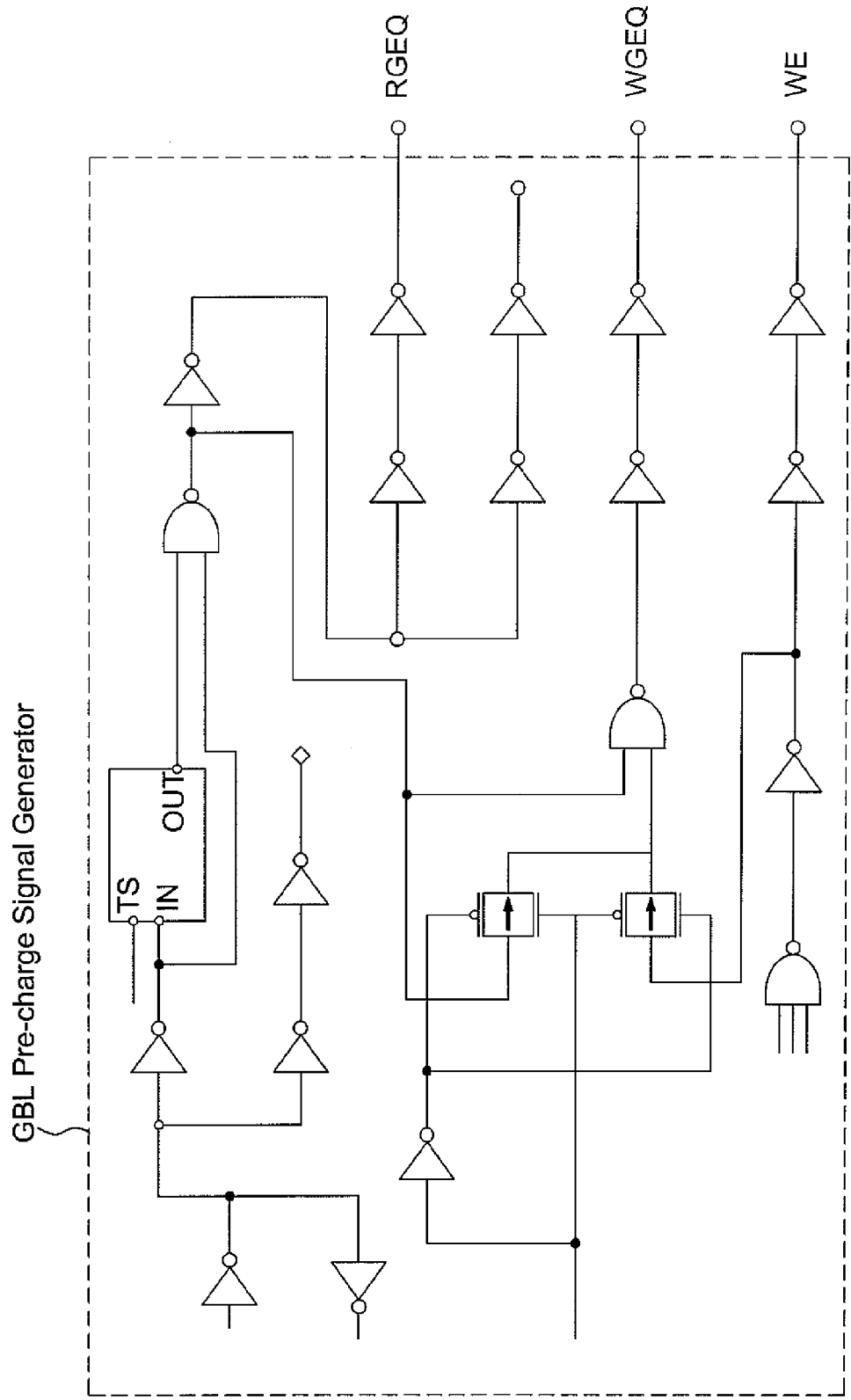
FIG. 5 illustrates an exemplary GBL pre-charge signal generator.

FIG. 5 illustrates a circuit diagram of an exemplary GBL pre-charge signal generator as shown in FIG. 2. In this circuit, the GEQ_read signal and the GEQ_write signal are generated separately, and are output to different output nodes RGEQ and WGEQ, respectively. Preferably, the GEQ_read signals and the GEQ_write signals have different timings. More preferably, the GEQ_write signal is earlier than the GEQ_read signal, as shown in FIG. 3. The GBL pre-charge signal generator further generates write enable signals, which are used by the MUX enable signal generator to control the operation of MUX (refer to FIG. 2). The timing of GEQ_read and GEQ_write signals are controlled to fit the timing of write enable signal on output node WE.

The separation of GEQ_read and GEQ_write signals has several advantageous features. First, with the global bit line pre-charge for write operations started early, the pre-charge may be finished earlier. This not only improves reliability of the respective memory circuit, but also makes the increase in the speed of back-to-back write operations (means a write operation immediately following another write operation) possible.

Second, with the global bit line pre-charge for read operations started later, the IO sensing margin is advantageously increased. Since the global bit line pre-charge is after the IO sensing, if the global bit line pre-charge starts before the IO sensing fully finishes, the subsequent read operations will be adversely affected. Therefore, by pushing the rising edge 62 of GEQ_read (FIG. 3) later in time than in conventional memories, the IO sensing margin, which is the time difference between the finish time of the IO sensing and the start time of the global bit line pre-charge, is increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of operating a memory, the method comprising:
   performing a write operation on a memory cell in the memory comprising:
      starting a first global bit line (GBL) pre-charge on a GBL; and
      after the first GBL pre-charge is started, enabling a word line to write into the memory cell, wherein the steps of starting the first GBL pre-charge and enabling the word line to write have a first time interval; and
   performing a read operation on the memory cell comprising:
      starting a second GBL pre-charge on the GBL; and
      after the second GBL pre-charge is started, enabling the word line to read from the memory cell, wherein the steps of starting the second GBL pre-charge and enabling the word line to read have a second time interval, and wherein the first time interval is greater than the second time interval.

2. The method of claim 1, wherein the first time interval is greater than the second time interval by greater than about 0.7 nanoseconds for a 430 MHz clock used by the memory.

3. The method of claim 1, wherein the first time interval is greater than the second time interval by greater than about 30 percent of a period of a clock used by the memory.

4. The method of claim 1, wherein the first GBL pre-charge substantially finishes before the respective step of enabling the word line in the write operation.

5. The method of claim 1, wherein the first GBL pre-charge is enabled by a first enable signal, and the second GBL pre-charge is enabled by a second enable signal, and wherein the first and the second enable signals are generated on different output nodes of a GBL pre-charge signal generator.

6. The method of claim 1, wherein the write operation further comprises applying a first MUX disable signal to disconnect a global bit line pre-charged by the first GBL pre-charge from a local bit line, and wherein the first MUX disable signal is timed before the step of starting the first GBL pre-charge.

7. The method of claim 6, wherein the steps of applying the first MUX disable signal and enabling the word line to write have a third time interval; and
   wherein the read operation further comprises applying a second MUX disable signal to disconnect the global bit line from the local bit line, and wherein the second MUX disable signal is timed before the step of starting the second GBL pre-charge, and wherein the steps of applying the second MUX disable signal and enabling the word line to read have a fourth time interval less than the third time interval.

8. The method of claim 1, wherein a rising edge of a signal on the word line enables the writing to the memory cell, and wherein the starting of the first GBL pre-charge occurs before an end of a falling edge of the signal on the word line, and wherein the falling edge is immediately earlier in time than the rising edge.

9. A method of operating a memory, the method comprising:
   generating a global bit line (GBL) pre-charge signal for a write operation (GEQ_write signal) on a first node of the memory;
   using the GEO write signal to start a first GBL pre-charge;
   generating a GBL pre-charge signal for a read operation (GEQ_read signal) on a second node of the memory, wherein the second node is different from the first node, and wherein the second node does not carry the GEQ_write signal; and
   using the GEQ_read signal to start a second GBL pre-charge, wherein the GEQ_write signal and the GEQ_read signal are NORed to control the first GBL pre-charge and the second GBL pre-charge.

10. The method of claim 9 further comprising:
   generating a first word line enable signal for the write operation, wherein the step of generating the GEQ_write signal is earlier in time than the step of generating the first word line enable signal; and
   generating a second word line enable signal for the read operation, wherein the step of generating the GEQ_read signal is earlier in time than the step of generating the second word line enable signal.

11. The method of claim 10, wherein the step of generating the GEQ_write signal and the step of generating the first word line enable signal have a first interval, the step of generating the GEQ_read signal and the step of generating the second word line enable signal have a second interval, and wherein the first interval is greater than the second interval.

12. The method of claim 9 further comprising:
   generating a write enable signal being inverted from the GEQ_write signal; and
   generating a multiplexer (MUX) enable signal using the GEQ_write signal as an input.

13. A method of operating a memory, the method comprising:
   generating a global bit line (GBL) pre-charge signal for a write operation (GEQ_write signal) on a first node of the memory;
   applying the GEQ_write signal to the memory to start a first GBL pre-charge to a GBL;
   writing into a memory cell controlled by the GBL, wherein the steps of starting the first GBL pre-charge and writing into the memory cell have a first time interval;
   generating a GBL pre-charge enable signal for a read operation (GEQ_read signal) on a second node of the memory, wherein the second node is different from the first node;
   applying the GEQ_read signal to the memory to start a second GBL pre-charge; and
   reading from the memory cell, wherein the steps of starting the second GBL pre-charge and reading from the memory cell have a second time interval smaller than the first time interval.

14. The method of claim 13, wherein the first and the second time intervals have a difference of greater than about 30 percent of a period of a clock used by the memory.

15. The method of claim 13 further comprising performing a NOR operation to the GEQ_write signal and the GEQ_read signal to generate a GBL equalization enable (GBLEQ) signal, and applying the GBLEQ signal to start an equalization of the GBL.

16. The method of claim 13 further comprising generating a MUX disable signal to disconnect a connection between a local bit line and the GBL, wherein the MUX disable signal is earlier in time than the GEQ_write signal.

17. The method of claim 16 further comprising generating a write enable signal using a same circuit as for generating the GEQ_write and the GEQ_read signals, wherein the step of generating the MUX disable signal uses a local sensor activation enable signal as a first input and the write enable signal as a second input.

18. A memory circuit comprising:
a global bit line (GBL) pre-charge signal generator comprising:
  a first output node outputting a GBL pre-charge signal for a write operation (GEQ_write signal);
  a second output node outputting a GBL pre-charge signal for a read operation (GEQ_read signal), wherein the second output node does not output the GEQ_write signal; and
  a third output node outputting a write enable signal.

19. The memory circuit of claim 18 further comprising a MUX signal generator comprising:
  a first input coupled to the third output node of the GBL pre-charge signal generator;
  a second input coupled to a local sensing activation enable signal node; and
  an output coupled to a multiplexer (MUX) of the memory, wherein the MUX controls a connection between a local bit line and a GBL.

20. The memory circuit of claim 19, wherein the MUX is configured to output a first MUX disable signal (write MUX disable signal) for the write operation and a second MUX disable signal (read MUX disable signal) for the read operation, and wherein the write MUX disable signal is earlier in time than a first respective word line enable signal by a first time interval, the read MUX disable signal is earlier in time than a second respective word line enable signal by a second time interval, and wherein the first time interval is greater than the second time interval.

21. The memory circuit of claim 18, wherein the GEQ_write signal is earlier in time than a first respective word line enable signal by a third time interval, the GEQ_read signal is earlier in time than a second respective word line enable signal by a fourth time interval, and wherein the third time interval is greater than the fourth time interval by a time difference.

22. The memory circuit of claim 21, wherein the time difference is greater than about 0.7 nanoseconds.

23. The memory circuit of claim 21, wherein the time difference is greater than about 30 percent of a period of a clock used by the memory circuit.

24. A memory circuit comprising:
a local bit line (LBL);
a global bit line (GBL);
a multiplexer (MUX) coupling the LBL and the GBL; and
a MUX signal generator comprising:
  a first input node coupled to a write enable signal node;
  a second input node coupled to a local sensing activation enable signal node; and
  an output node coupled to the MUX.

25. The memory circuit of claim 24 further comprising a GBL pre-charge signal generator comprising:
  a first output node outputting a GBL pre-charge enable signal for a write operation (GEQ_write signal);
  a second output node outputting a GBL pre-charge enable signal for a read operation (GEQ_read signal); and
  a third output node outputting a write enable signal, wherein the third output node is coupled to the first input node of the MUX signal generator.

26. The memory circuit of claim 25, wherein the GEQ_write signal is earlier in time than a first respective word line enable signal by a first time interval, the GEQ_read is earlier in time than a second respective word line enable signal by a second time interval, and wherein the first time interval is greater than the second time interval.

27. The memory circuit of claim 25 further comprising a NOR gate comprising:
  a first input coupled to the first output node of the GBL pre-charge signal generator;
  a second input coupled to the second output node of the GBL pre-charge signal generator; and
  an output coupled to an equalization circuit of the GBL.

28. A memory circuit comprising:
a first and a second local bit line (LBL);
a first and a second global bit line (GBL);
a multiplexer (MUX) coupling the first LBL to the first GBL, and the second LBL to the second GBL;
a GBL pre-charge signal generator comprising:
  a first output node outputting a GBL pre-charge signal for a write operation (GEQ_write signal);
  a second output node outputting a GBL pre-charge enable signal for a read operation (GEQ_read signal); and
  a third output node outputting a write enable signal;
a MUX signal generator comprising:
  a first input coupled to the third output node of the GBL pre-charge signal generator;
  a second input node coupled to a local sensing activation enable signal node; and
  an output node coupled to the MUX; and
a NOR gate comprising:
  a first input coupled to the first output node of the GBL pre-charge signal generator;
  a second input coupled to the second output node of the GBL pre-charge signal generator; and
  an output coupled to an equalization circuit coupled between the first and the second GBLs.

29. The memory circuit of claim 28, wherein the GEQ_write signal is earlier in time than a first respective word line enable signal by a first time interval, the GEQ_read is earlier than a second respective word line enable signal by a second time interval, and wherein the first time interval is greater than the second time interval by a difference.

30. The memory circuit of claim 29, wherein the difference is greater than about 0.7 nanoseconds.

31. The memory circuit of claim 29, wherein the difference is greater than about 30 percent of a period of a clock used by the memory.

* * * * *

UNITED STATES PATENT AND TRADEMARK OFFICE
CERTIFICATE OF CORRECTION

PATENT NO. : 7,733,724 B2  Page 1 of 1
APPLICATION NO. : 11/970188
DATED : June 8, 2010
INVENTOR(S) : Hsu et al.

It is certified that error appears in the above-identified patent and that said Letters Patent is hereby corrected as shown below:

In Col. 7, line 65, claim 9, delete "GEO" and insert --GEQ_--.

Signed and Sealed this

Third Day of August, 2010

David J. Kappos
*Director of the United States Patent and Trademark Office*